(12) United States Patent
Wang et al.

(10) Patent No.: US 10,008,170 B2
(45) Date of Patent: Jun. 26, 2018

(54) GATE DRIVER ON ARRAY CIRCUIT AND DISPLAY DEVICE CAPABLE OF PROLONGING CHARGING TIME OF PIXEL

(71) Applicant: SHENZHEN CHINA STAR OPTOELECTRONICS TECHNOLOGY CO., LTD., Shenzhen, Guangdong (CN)

(72) Inventors: Xiaoxiao Wang, Guangdong (CN); Peng Du, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 140 days.

(21) Appl. No.: 14/905,879

(22) PCT Filed: Dec. 30, 2015

(86) PCT No.: PCT/CN2015/099698
§ 371 (c)(1),
(2) Date: Jan. 18, 2016

(87) PCT Pub. No.: WO2017/088265
PCT Pub. Date: Jun. 1, 2017

(65) Prior Publication Data
US 2017/0229084 A1    Aug. 10, 2017

(30) Foreign Application Priority Data

Nov. 24, 2015 (CN) ......................... 2015 1 0825091

(51) Int. Cl.
*G09G 3/36* (2006.01)

(52) U.S. Cl.
CPC ......... *G09G 3/3677* (2013.01); *G09G 3/3696* (2013.01); *G09G 2300/0809* (2013.01)

(58) Field of Classification Search
CPC ............... G09G 3/3677; G09G 3/3696; G09G 2300/0809
See application file for complete search history.

(56) References Cited

U.S. PATENT DOCUMENTS

2007/0164954 A1* 7/2007 Yang .................... G09G 3/3677
                                                            345/88
2011/0150169 A1* 6/2011 Lin ........................ G11C 19/28
                                                            377/64

(Continued)

FOREIGN PATENT DOCUMENTS

CN    101504829 A    8/2009
CN    103500550 A    1/2014

(Continued)

*Primary Examiner* — Ryan A Lubit
(74) *Attorney, Agent, or Firm* — Ladas & Parry LLP (57) ABSTRACT

The present invention proposes a GOA circuit and a display device adopting the same. The GOA circuit includes thirteen transistors and a first capacitor. The GOA circuit can be driven in 2D and 3D driving modes to prolong charging time of each pixel. Each two GOA circuit units share a set of Nth stage start pulse signals, Nth stage gate pulse signals and eight clock pulse signals. Because the charging time of each pixel is prolonged, the display device can show images with better display quality.

20 Claims, 6 Drawing Sheets

(56) References Cited

U.S. PATENT DOCUMENTS

| | | | |
|---|---|---|---|
| 2014/0292628 A1* | 10/2014 | Park | G09G 3/3677 345/100 |
| 2015/0097817 A1* | 4/2015 | Chung | G09G 3/3696 345/206 |
| 2015/0371599 A1* | 12/2015 | Xiao | G09G 3/20 345/212 |
| 2016/0275887 A1* | 9/2016 | Xiao | G09G 3/3648 |
| 2016/0284294 A1* | 9/2016 | Dai | G09G 3/3648 |
| 2017/0178557 A1* | 6/2017 | Li | G09G 3/2092 |

FOREIGN PATENT DOCUMENTS

| | | |
|---|---|---|
| CN | 103928008 A | 7/2014 |
| CN | 104050941 A | 9/2014 |
| CN | 104091577 A | 10/2014 |

* cited by examiner

GATE DRIVER ON ARRAY CIRCUIT AND DISPLAY DEVICE CAPABLE OF PROLONGING CHARGING TIME OF PIXEL

BACKGROUND OF THE INVENTION

1. Field of the Invention

The present invention relates to a display device, and more specifically, to a display device adopting gate driver on array (GOA) circuits.

2. Description of the Prior Art

With liquid crystal displays (LCD), low cost and high quality are essential criteria that industrial technology must meet. GOA is a method commonly used to lower the cost. It enables a glass substrate to serve the function of a transistor gate by adopting the thin-film transistor (TFT) LCD array process. It lowers the cost by omitting the gate side drive integrated circuit (IC), and enhances the LCD's market competitiveness by making frameless designs possible. Current ultra high definition (UHD) panels on the market are driven by 60 HZ if they are two-dimensional (2D) panels. Given that UHD panels have higher resolution, an area covered by metal wires and TFTs tuning pixels on and off within a panel must be minimized to ensure a higher aperture ratio. With conventional technology, it will lead to a problem that pixels are not sufficiently charged and the display quality is directly affected.

Some conventional products adopting UHD panels are equipped with three-dimensional (3D) display effect with ultra-high resolution. Therefore, most large-size UHD products are equipped with 3D function. When a viewer is watching UHD 3D panels, to ensure that both the left eye and right eye receive signals of 60 HZ, the frame rate must be doubled to 120 HZ. Given the limit of bandwidth, a gate IC cannot drive a product at a 120*2160 frequency.

SUMMARY OF THE INVENTION

An object of the present invention is to provide a GOA circuit and a display device adopting the same, so to improve the problem of insufficient charging of pixels in a LCD with conventional technology.

According to the present invention, a gate driver on array (GOA) circuit comprises a plurality of GOA units connected in cascade, with an Nth stage GOA unit outputting a Nth stage gate pulse signal from an output terminal. The Nth stage GOA unit comprises: a first switch component, comprising a first control terminal, a first connecting terminal and a second connecting terminal, with the first connecting terminal and the first control terminal connected to a (N−4)th stage start pulse signal or a (N−4)th stage gate pulse signal; a second switch component, comprising a second control terminal, a third connecting terminal and a fourth connecting terminal, with the second control terminal connected to the Nth pre-charged voltage node, the third connecting terminal connected to the first clock signal, and the fourth connecting terminal connected to the output terminal; a third switch component, comprising a third control terminal, a fifth connecting terminal and a sixth connecting terminal, with the third control terminal connected to the second connecting terminal, the fifth connecting terminal connected to the first clock signal, and the sixth connecting terminal connected to the Nth stage start pulse signal; a fourth switch component, comprising a fourth control terminal, a seventh connecting terminal and an eighth connecting terminal, with the fourth control terminal and the seventh connecting terminal connected to the first clock signal; a fifth switch component, comprising a fifth control terminal, a ninth connecting terminal and a tenth connecting terminal, with the fifth control terminal receiving the Nth stage pre-charged voltage node, the ninth connecting terminal connected to the eighth connecting terminal, and the tenth connecting terminal connected to a first voltage source; a sixth switch component, comprising a sixth control terminal, an eleventh connecting terminal and a twelfth connecting terminal, with the sixth control terminal connected to the eighth connecting terminal, the eleventh connecting terminal connected to the first clock signal, and the twelfth connecting terminal connected to the first voltage source; a seventh switch component, comprising a seventh control terminal, a thirteenth connecting terminal and a fourteenth connecting terminal, with the seventh control terminal connected to the fifth control terminal, the thirteenth connecting terminal connected to the twelfth connecting terminal, and the fourteenth connecting terminal connected to the first voltage source; an eighth switch component, comprising an eighth control terminal, a fifteenth connecting terminal and a sixteenth connecting terminal, with the eighth control terminal connected to the twelfth connecting terminal and the thirteenth connecting terminal, the fifteenth connecting terminal connected to the third control terminal, and the sixteenth connecting terminal connected to the output terminal; a ninth switch component, comprising a ninth control terminal, a seventeenth connecting terminal and an eighteenth connecting terminal, with the ninth control terminal connected to the eighth control terminal, the seventeenth control terminal connected to the output terminal, and the eighteenth connecting terminal connected to the first voltage source; a tenth switch component, comprising a tenth control terminal, a nineteenth connecting terminal and a twentieth connecting terminal, with the tenth control terminal connected to a second clock signal, the nineteenth connecting terminal connected to the output terminal, and the twentieth connecting terminal receiving the (N−4)th stage start pulse signal or gate pulse signal; an eleventh switch component, comprising an eleventh control terminal, a twenty-first connecting terminal and a twenty-second connecting terminal, with the eleventh control terminal connected to the second clock signal, the twenty-first connecting terminal connected to the output terminal, and the twenty-second connecting terminal connected to the first voltage source; a twelfth switch component, comprising a twelfth control terminal, a twenty-third connecting terminal and a twenty-fourth connecting terminal, with the twelfth control terminal connected to a (N+4)th stage start pulse signal or gate pulse signal, the twenty-third pathway connected to the third control terminal, and the twenty-fourth connecting terminal connected to the first voltage source; and a thirteenth switch component, comprising a thirteenth control terminal, a twenty-fifth connecting terminal and a twenty-sixth connecting terminal, with the thirteenth control terminal receiving the (N+4)th stage start pulse signal or gate pulse signal, the twenty-fifth connecting terminal connected to the output terminal, and the twenty-sixth connecting terminal connected to the first voltage source. N is a positive integer.

In another aspect of the present invention, the GOA circuit further comprises a capacitor, with its two ends connected to the third control terminal and the output terminal respectively.

In another aspect of the present invention, all switch components, from the first to the thirteenth, are N-type metal oxide semiconductor (NMOS) transistors.

In another aspect of the present invention, all switch components, from the first to the thirteenth, are P-type metal oxide semiconductor (PMOS) transistors.

In another aspect of the present invention, the first clock signal and the second clock pulse signal are inversed.

In another aspect of the present invention, a duty ratio of the first clock signal and the second clock pulse signal is 50%.

In another aspect of the present invention, the pulse width of the first clock signal of the GOA circuit when driving two-dimensional (2D) images is twice the pulse width of the first clock signal of the GOA circuit when driving three-dimensional (3D) images.

In another aspect of the present invention, the pulse width of the first clock signal of the GOA circuit when driving 2D images are twice the pulse width of the first clock signal of the GOA circuit when driving 3D images.

In another aspect of the present invention, the phase difference between the first clock signal connected to the Nth stage GOA circuit unit and the first clock signal connected to the (N+1)th stage GOA circuit unit is one-fourth of the pulse width of the first clock signal when the GOA circuit is driving 2D images.

In still another aspect of the present invention, no phase difference exists between the first clock signal connected to the Nth stage GOA circuit unit and the first clock signal connected to the (N+1)th stage GOA circuit unit, and no phase difference exists between the first clock signal connected to the (N+2)th stage GOA circuit unit and the first clock signal connected to the (N+3)th stage GOA circuit unit when the GOA circuit is driving 3D images.

In yet another aspect of the present invention, the phase difference between the first clock signal connected to the Nth stage GOA unit and the first clock signal connected to the (N+2)th stage GOA unit is half of the pulse width of the first clock signal.

According to the present invention, a display device comprises a liquid crystal display panel for showing images, and a GOA circuit integrated on the liquid crystal display panel as provided above.

Comparing with conventional technology, the present invention provides a GOA circuit and a display device adopting the same. By fine-tuning the timing of the gate waveform to pre-charge pixels, charging time of each pixel can be prolonged, so to solve the problem of insufficient charging time for pixels. In addition, in the GOA circuit of the present invention, each two GOA circuit units share a set of start pulse signals, gate pulse signals and clock pulse signals. When displaying a 3D image, each two GOA units can output gate pulse signals to two gate lines simultaneously, so to turn on two rows of pixels at the same time. Therefore, the GOA circuit of the present invention can be used to drive large-size UHD panels displaying 2D/3D images.

These and other features, aspects and advantages of the present disclosure will become understood with reference to the following description, appended claims and accompanying figures.

DETAILED DESCRIPTION OF PREFERRED EMBODIMENTS

In order to illustrate the technique and effects of the present invention, a detailed description will be disclosed by the following disclosure in conjunction with figures. It is noted that the same components are labeled by the same number.

Figure 1:
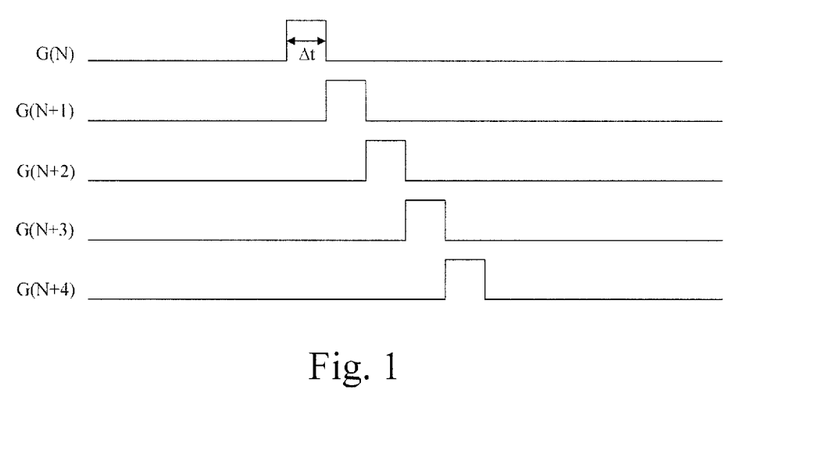
FIG. 1 is a timing diagram of gate pulse signals from a Nth stage through a (N+4)th stage of a conventional GOA circuit.

Please refer to FIG. 1. FIG. 1 is a timing diagram of gate pulse signals from a Nth stage through a (N+4)th stage of a conventional GOA circuit. For a conventional large-size UHD panel with 60 HZ frame rate, a first time period ($\Delta t$) of a GOA signal to turn on transistors corresponded to pixels is about 7.4 ms.

Figure 2:
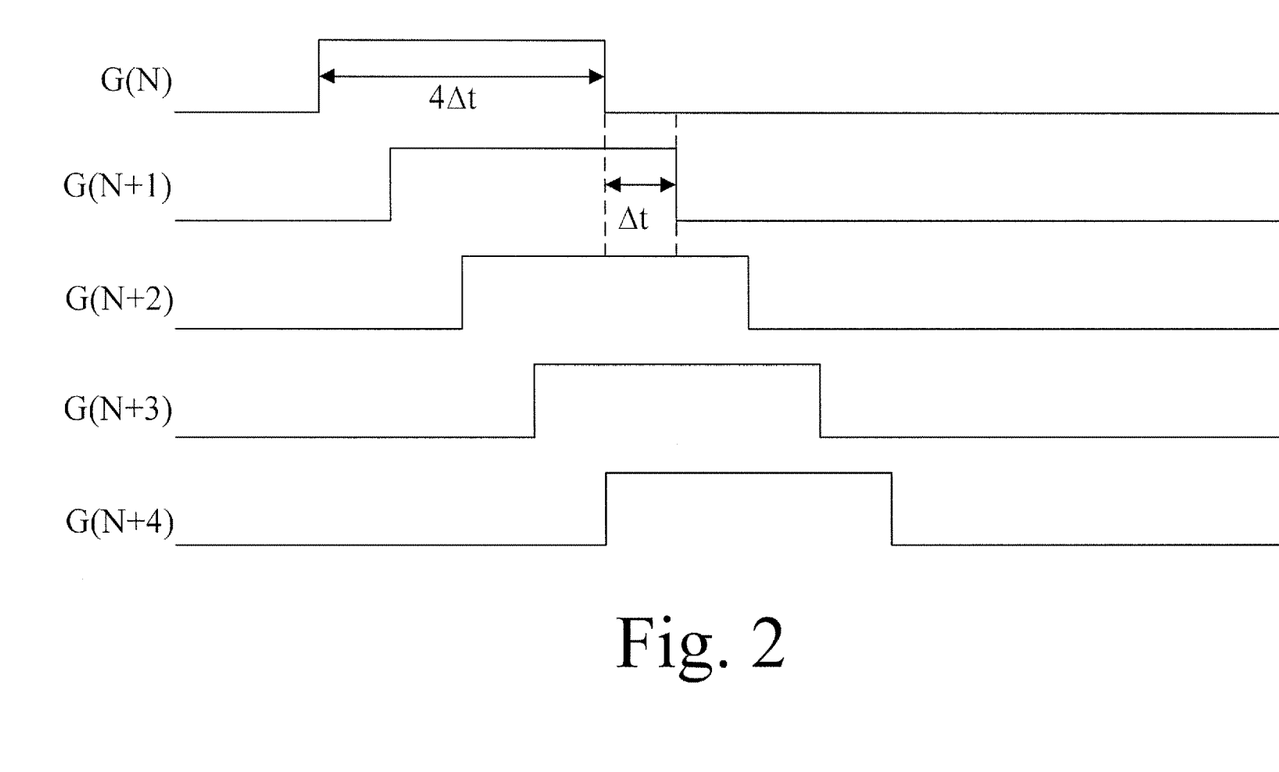
FIG. 2 is a timing diagram of gate pulse signals from the Nth stage to the (N+4)th stage of the GOA circuit of the present invention in a 2D driving mode.

Please refer to FIG. 1 and FIG. 2. FIG. 2 is a timing diagram of gate pulse signals from the Nth stage to the (N+4)th stage of the GOA circuit of the present invention in a 2D driving mode. When the present invention is displaying a 2D image, the pulse width from a Nth stage gate pulse signal G(N) to a (N+4)th stage gate pulse signal G(N+4) is four times the first time period, namely (4$\Delta t$). The turn-on time of gates is thus prolonged. Given that the pulse width of the Nth stage gate pulse signal G(N) is four times the first time period ($\Delta t$), the first three-fourths of the pulse width of the gate pulse signal G(N), namely three times of the first time period ($\Delta t$), serve as pre-charging voltage.

Figure 3:
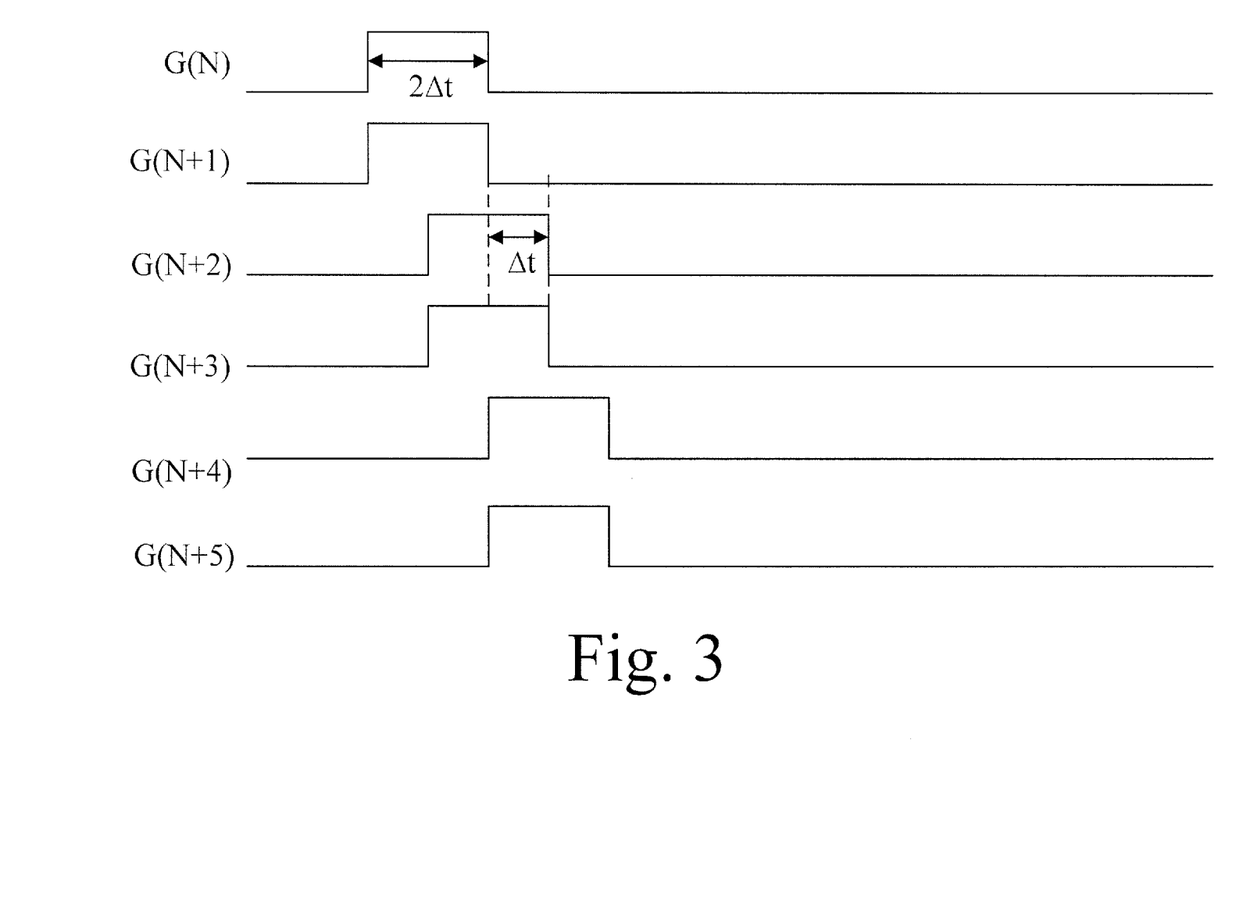
FIG. 3 is a timing diagram of gate pulse signals from the Nth stage to the (N+4)th stage of the GOA circuit of the present invention in a 3D driving mode.

Please refer to FIG. 1, FIG. 2 and FIG. 3. FIG. 3 is a timing diagram of gate pulse signals from the Nth stage to the (N+4)th stage of the GOA circuit of the present invention in a 3D driving mode. Comparing with FIG. 2, the frequency of gate pulse signals outputted by the GOA circuit must be doubled to 120 HZ when the display panel switches to a 3D mode, to ensure that both a viewers' left eye and right eye receive 60 HZ signals. The Nth stage gate pulse signal G(N) and the (N+1)th stage gate pulse signal G(N+1) are turned on at the same time. The (N+2)th stage gate pulse signal G(N+2) and the (N+3)th stage gate pulse signal G(N+3) are turned on at the same time. The (N+4)th gate pulse signal G(N+4) and the (N+5)th stage gate pulse signal G(N+5) are turned on at the same time. When displaying a 3D image, the pulse width of the Nth stage gate pulse signal G(N) is twice the first time period ($\Delta t$). It means that half of the pulse width of the gate pulse signal G(N), namely two first time periods ($\Delta t$), serves as a pre-charging voltage.

Figure 4:
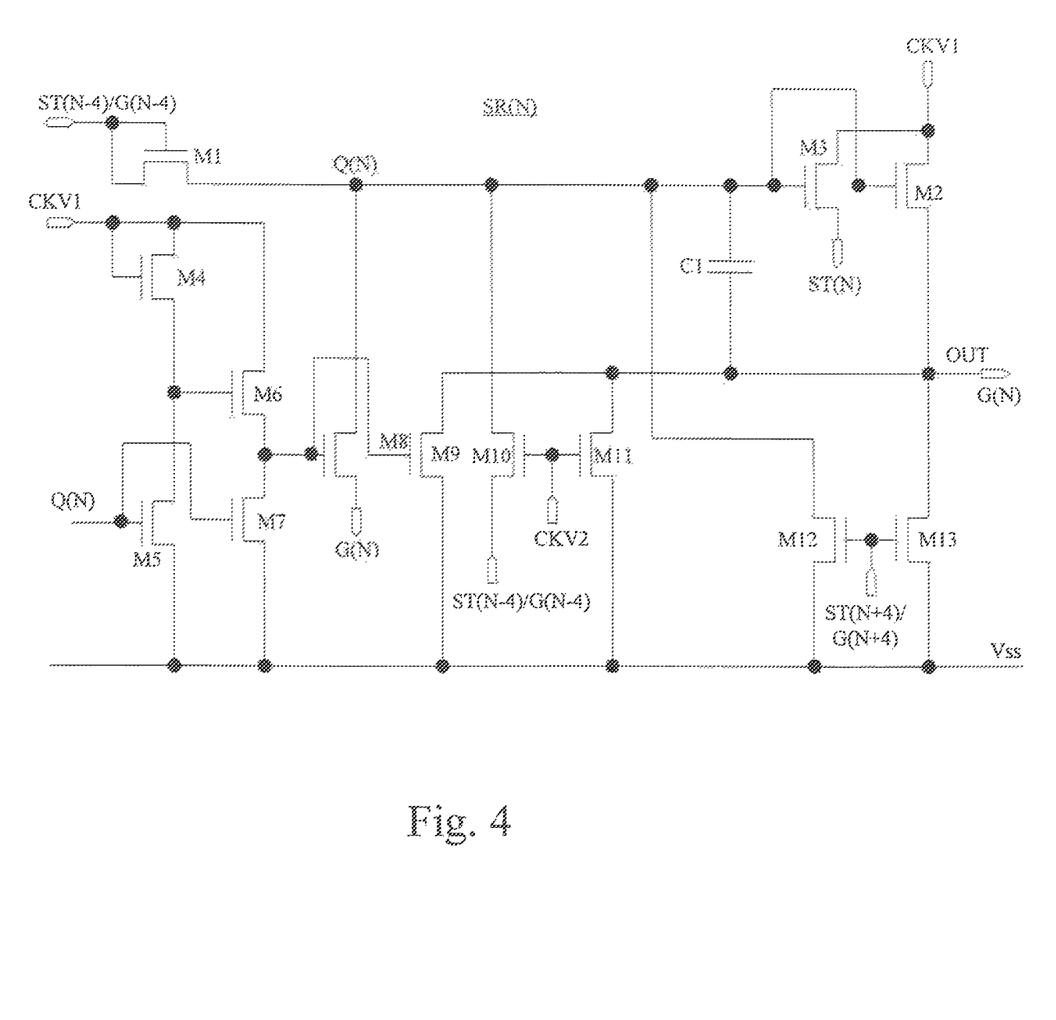
FIG. 4 is a circuit diagram of GOA units of GOA circuits of the present invention.

Please refer to FIG. 4. FIG. 4 is a circuit diagram of GOA units of GOA circuits of the present invention. A GOA circuit of the present embodiment comprises a plurality of GOA units, which are connected in cascade. A Nth stage GOA unit SR(N) outputs a gate pulse signal G(N) of the Nth stage from an output terminal OUT. The Nth stage GOA unit SR(N) outputs the gate pulse signal G(N) from the output terminal OUT based on a (N−4)th stage start pulse signal ST(N−4) or a (N−4)th stage gate pulse signal G(N−4), and a first clock signal CK1. N is a positive integer. In the present embodiment, GOA units SR(N) to SR(N+7) of the Nth stage to the (N+7)th stage connect to clock signals CK1 to CK8 respectively, and take their respective clock signal as a first clock signal. Furthermore, GOA units SR(N) to SR(N+7) from the Nth stage to the (N+7)th stage connect to a second clock signal CKV2, and the second clock signal CKV2 is inverted from the first clock signal CKV1. For example, the Nth stage GOA unit SR(N)'s first clock signal CKV1 is the clock signal CK1, and its second clock signal CKV2 is the clock signal CK5. The (N+1)th stage GOA unit SR(N+1)'s first clock signal CKV1 is clock signal CK2, and its second clock signal CKV2 is the clock signal CK6. The (N+2)th stage GOA unit SR(N+2)'s first clock signal CKV1 is the clock signal CK3, and its second clock signal CKV2 is the clock signal CK7, and so on and so forth.

With large-size panels, circuits suffer more serious resistance-capacitance (RC) delays. Therefore, clock signals that drive GOA circuits are usually four, or six, or eight clock signals with different cycles. In the present embodiment, the GOA circuit has eight clock signals, CK1 to CK8, with different cycles. In practice, the number and pulse width of clock signals can be adjusted according to different needs. The duty ratio of each clock signal, from CK1 to CK8, is 50%. The waveform of the Nth stage start pulse signal ST(N) is the same as that of the Nth stage gate pulse signal G(N), and the time period of the two neighboring clock signals is the first time period ($\Delta t$). The (N−4)th stage start pulse signal ST(N−4) elevates the node voltage of the Nth stage pre-charged voltage node signal pulse Q(N). The transmission method of GOA units at different stages is that the GOA signal generated by the Nth stage GOA unit SR(N) will be transmitted to and drive the (N+4)th stage GOA unit. For example, a GOA signal G(1) generated by the first stage GOA unit drives the fifth stage GOA unit, then the fifth stage GOA unit generates a GOA signal G(5) to drive the ninth stage GOA unit, and so on and so forth.

The Nth stage GOA unit comprise a first switch component M1, a second switch component M2, and third switch component M3, a fourth switch component M4, a fifth switch component M5, a sixth switch component M6, and seventh switch component M7, an eighth switch component M8, a ninth switch component M9, a tenth switch component M10, an eleventh switch component M11, a twelfth switch component M12, a thirteenth switch component M13 and a capacitor C1. The first switch component M1 comprises a first control terminal, a first connecting terminal and a second connecting terminal. The first connecting terminal and the first control terminal connect the (N−4)th stage start pulse signal ST(N−4) or the (N−4)th stage gate pulse signal G(N−4). The second switch component M2 comprises a second control terminal, a third connecting terminal and a fourth connecting terminal. The second control terminal connects the Nth stage pre-charged voltage node Q(N). The third connecting terminal connects the first clock signal CK1, and the fourth connecting terminal connects an output terminal OUT. The third switch component M3 comprises a third control terminal, a fifth connecting terminal and a sixth connecting terminal. The third control terminal connects the second connecting terminal, the fifth connecting terminal connects the first clock signal CKV1, and the sixth connecting terminal outputs the Nth stage start pulse signal ST(N). The fifth switch component M5 comprises a fifth control terminal, a ninth connecting terminal and a tenth connecting terminal. The fifth control terminal receives the Nth stage pre-charged voltage node Q(N), the ninth pathway connects the eighth connecting terminal, and the tenth connecting terminal connects a first voltage source Vss. The sixth switch component M6 comprises a sixth control terminal, an eleventh connecting terminal and a twelfth connecting terminal. The sixth control terminal connects the eighth connecting terminal, the eleventh connecting terminal connects the first clock signal CKV1, and the twelfth connecting terminal connects the first voltage source Vss. The seventh switch component M7 comprises a seventh control terminal, a thirteenth connecting terminal and a fourteenth connecting terminal. The seventh control terminal connects the fifth control terminal, the thirteenth connecting terminal connects the twelfth connecting terminal, and the fourteenth connecting terminal connects the first voltage source Vss. The eighth switch component M8 comprises an eighth control terminal, a fifteenth connecting terminal and a sixteenth connecting terminal. The eighth control terminal connects the twelfth connecting terminal and the thirteenth connecting terminal. The fifteenth connecting terminal connects the third control terminal, and the sixteenth connecting terminal connects the output terminal OUT. The ninth switch component M9 comprises a ninth control terminal, a seventeenth connecting terminal and an eighteenth connecting terminal. The ninth control terminal connects the eighth control terminal, the seventeenth connecting terminal connects the output terminal OUT, and the eighteenth connecting terminal connects the first voltage source Vss. The tenth switch component M10 comprises a tenth control terminal, a nineteenth connecting terminal and a twentieth connecting terminal. The tenth control terminal connects the second clock signal CKV2, the nineteenth connecting terminal connects the pre-charged voltage node Q(N) and the twentieth connecting terminal receives the (N−4)th stage start pulse signal or gate pulse signal. The eleventh switch component M11 comprises an eleventh control terminal, a twenty-first connecting terminal and a twenty-second connecting terminal. The eleventh control terminal connects the second clock signal CKV2, the twenty-first connecting terminal connects the output terminal OUT, and the twenty-second connecting terminal connects the first voltage source Vss. The twelfth switch component M12 comprises a twelfth control terminal, a twenty-third connecting terminal and a twenty-fourth connecting terminal. The twelfth control terminal connects the (N+4)th stage start pulse signal or the (N+4)th stage gate pulse signal, the twenty-third connecting terminal connects the third control terminal, and the twenty-fourth connecting terminal connects the first voltage source Vss. The thirteenth switch component M13 comprises a thirteenth control terminal, a twenty-fifth connecting terminal and a twenty-sixth connecting terminal. The thirteenth switch component M13 receives the (N+4)th stage start pulse signal ST(N+4) or gate pulse signal G(N+4), the twenty-fifth connecting terminal connects the output terminal OUT, and the twenty-sixth connecting terminal connects the first voltage source Vss. Two ends of the capacitor C1 connect the third control terminal and the output terminal OUT respectively.

In the present embodiment, all components, from the first switch component M1 to the thirteenth switch component M13, are N-type metal oxide semiconductor (NMOS) transistors. Of course, M1 to M13 can be realized by adopting other switch components, such as P-type metal oxide semiconductor (PMOS) transistors.

The following text, presuming all switch components, from the first switch component M1 to the thirteenth switch component M13, are NMOS transistors, explains the specific implementation and operation principles of the present invention.

Figure 5:
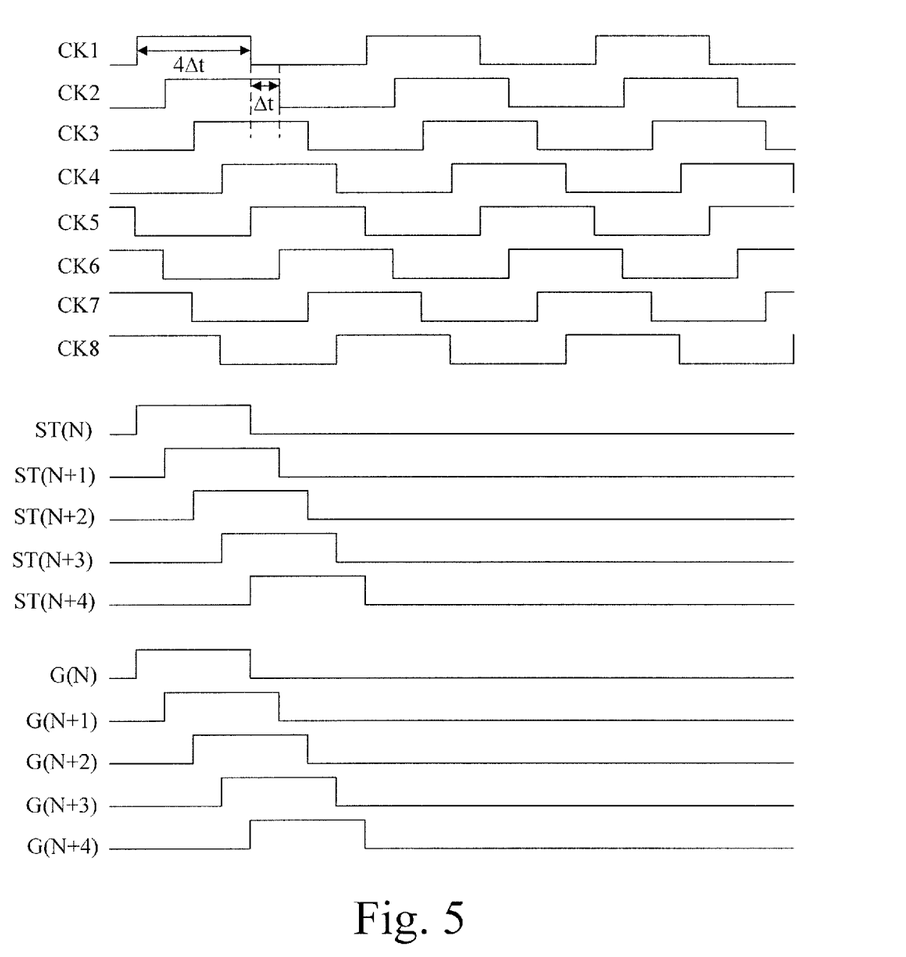
FIG. 5 is shows waveforms of signals from the Nth stage through the (N+4)th stage GOA units when the GOA circuit in FIG. 4 is in a 2D driving mode.

Please refer to FIG. 5. FIG. 5 is shows waveforms of signals from the Nth stage through the (N+4)th stage GOA units when the GOA circuit in FIG. 4 is in a 2D driving mode. When the GOA circuit drives a 2D image, a phase difference between the first clock signal CKV1 connected to the Nth stage GOA unit SR(N) and the first clock signal CKV1 connected to the (N+1)th stage GOA unit SR(N+1) is one-fourth of the pulse width of the first clock signal CKV1, namely, four times the first time period (Δt). Given that the pulse width of the Nth stage GOA pulse signal G(N) is four times the first time period (Δt), the first three-fourths of the pulse width of the gate pulse signal G(N), namely, three times the first time period (Δt), serves as a pre-charging voltage.

Figure 6:
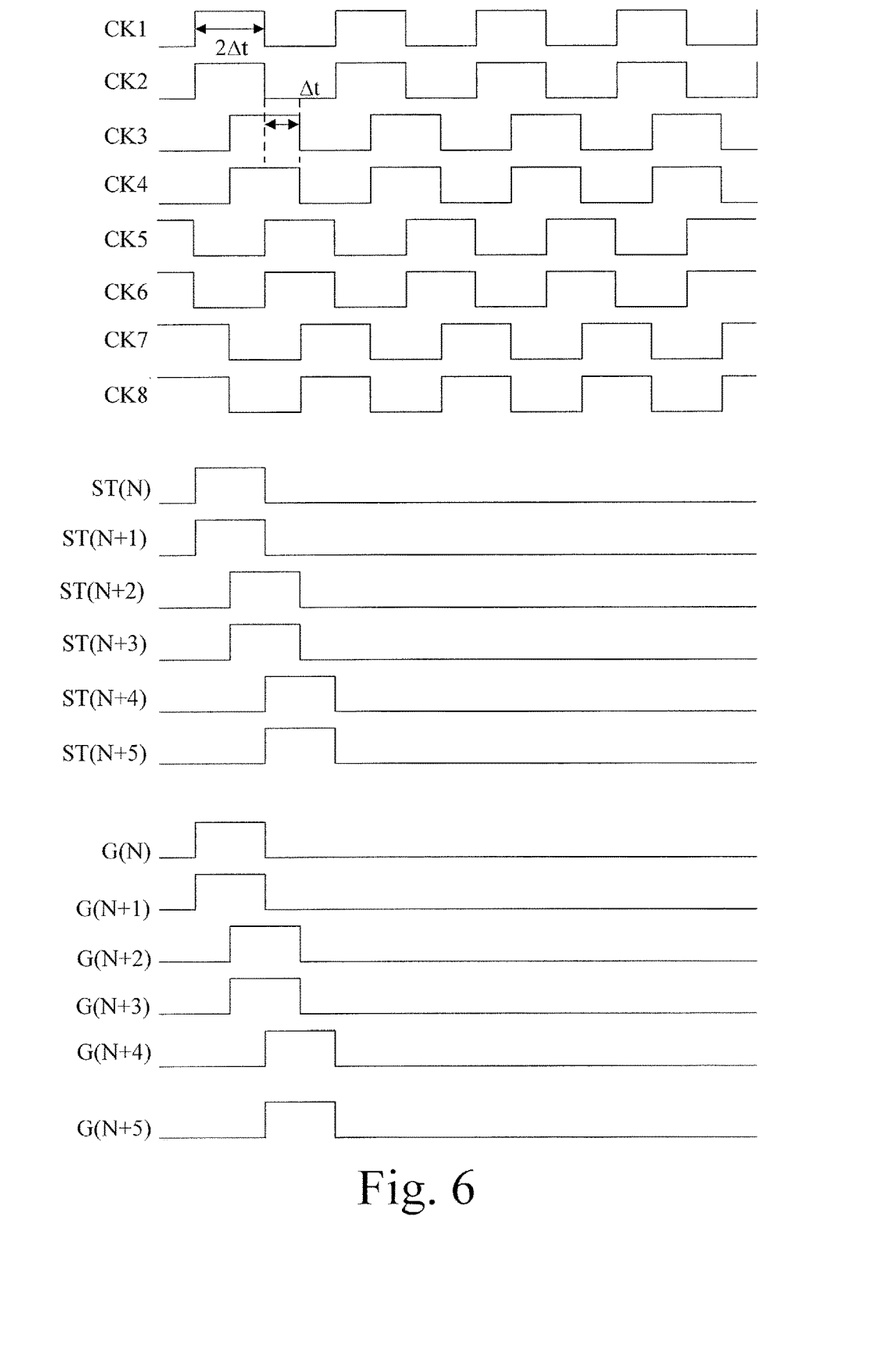
FIG. 6 shows waveforms of signals from the Nth stage through the (N+4)th stage GOA units when the GOA circuit in FIG. 4 is in a 3D driving mode.

Please refer to FIG. 6. FIG. 6 shows waveforms of signals from the Nth stage through the (N+4)th stage GOA units when the GOA circuit in FIG. 4 is in a 3D driving mode. When the GOA circuit drives a 3D image, there is no phase difference between the clock signal CK1 (i.e. the clock signal CK1 in FIG. 6) connected to the Nth stage GOA unit SR(N) and the first clock signal CKV1 (i.e. the clock signal CK2 in FIG. 6) connected to the (N+1)th stage GOA unit SR(N+1). And, there is no phase difference between the first clock signal CKV1 (i.e. the clock signal CK3 in FIG. 6) connected to the (N+2)th stage GOA unit SR(N+2) and the first clock signal CKV1 (i.e. the clock signal CK4 in FIG. 6) connected to the (N+3)th stage GOA unit SR(N+3). The phase difference between the first clock signal CKV1 (i.e. the clock signal CK1 in FIG. 6) connected to the Nth stage GOA unit SR(N) and the first clock signal CKV1 (i.e. the clock signal CK3 in FIG. 6) connected to the (N+2)th stage GOA unit SR(N+2) is half of the pulse width of the first clock signal CKV1, namely, twice the first time period (Δt). When displaying a 3D image, the pulse width of the Nth stage gate pulse signal G(N) is twice the first time period (Δt). Therefore, half of the pulse width of the gate pulse signal G(N), namely one time period (Δt), still serves as the pre-charging voltage. In addition, each two GOA units, such as GOA units SR(N) and SR(N+1), SR(N+2) and SR(N+3), can output gate pulse signals to two gate lines simultaneously, so to turn on two rows of pixels at the same time. Therefore, the present embodiment can also control the display of 3D images without changing the outputted gate pulse signal.

The present invention has a GOA circuit comprising GOA units, as shown in FIG. 4, can be adopted by a display device. The display device has an LCD panel to display images. The GOA circuit can be assembled on the LCD panel.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A gate driver on array (GOA) circuit, comprising a plurality of GOA units, connected in cascade, with an Nth stage GOA unit outputting a Nth stage gate pulse signal from an output terminal; the Nth stage GOA unit comprises:
    a first switch component, comprising a first control terminal, a first connecting terminal and a second connecting terminal, with the first connecting terminal and the first control terminal connected to a (N−4)th stage start pulse signal or a (N−4)th stage gate pulse signal;
    a second switch component, comprising a second control terminal, a third connecting terminal and a fourth connecting terminal, with the second control terminal connected to the Nth pre-charged voltage node, the third connecting terminal connected to the first clock signal, and the fourth connecting terminal connected to the output terminal;
    a third switch component, comprising a third control terminal, a fifth connecting terminal and a sixth connecting terminal, with the third control terminal connected to the second connecting terminal, the fifth connecting terminal connected to the first clock signal, and the sixth connecting terminal connected to the Nth stage start pulse signal;
    a fourth switch component, comprising a fourth control terminal, a seventh connecting terminal and an eighth connecting terminal, with the fourth control terminal and the seventh connecting terminal connected to the first clock signal;
    a fifth switch component, comprising a fifth control terminal, a ninth connecting terminal and a tenth connecting terminal, with the fifth control terminal receiving the Nth stage pre-charged voltage node, the ninth connecting terminal connected to the eighth connecting terminal, and the tenth connecting terminal connected to a first voltage source;
    a sixth switch component, comprising a sixth control terminal, an eleventh connecting terminal and a twelfth connecting terminal, with the sixth control terminal connected to the eighth connecting terminal, the eleventh connecting terminal connected to the first clock signal, and the twelfth connecting terminal connected to the first voltage source;
    a seventh switch component, comprising a seventh control terminal, a thirteenth connecting terminal and a fourteenth connecting terminal, with the seventh control terminal connected to the fifth control terminal, the thirteenth connecting terminal connected to the twelfth connecting terminal, and the fourteenth connecting terminal connected to the first voltage source;
    an eighth switch component, comprising an eighth control terminal, a fifteenth connecting terminal and a sixteenth connecting terminal, with the eighth control terminal connected to the twelfth connecting terminal and the thirteenth connecting terminal, the fifteenth connecting terminal connected to the third control terminal, and the sixteenth connecting terminal connected to the output terminal;
    a ninth switch component, comprising a ninth control terminal, a seventeenth connecting terminal and an eighteenth connecting terminal, with the ninth control terminal connected to the eighth control terminal, the seventeenth control terminal connected to the output terminal, and the eighteenth connecting terminal connected to the first voltage source;
    a tenth switch component, comprising a tenth control terminal, a nineteenth connecting terminal and a twentieth connecting terminal, with the tenth control terminal connected to a second clock signal, the nineteenth connecting terminal connected to the output terminal, and the twentieth connecting terminal receiving the (N−4)th stage start pulse signal or gate pulse signal;
    an eleventh switch component, comprising an eleventh control terminal, a twenty-first connecting terminal and a twenty-second connecting terminal, with the eleventh control terminal connected to the second clock signal, the twenty-first connecting terminal connected to the output terminal, and the twenty-second connecting terminal connected to the first voltage source;
    a twelfth switch component, comprising a twelfth control terminal, a twenty-third connecting terminal and a twenty-fourth connecting terminal, with the twelfth control terminal connected to a (N+4)th stage start pulse signal or gate pulse signal, the twenty-third pathway connected to the third control terminal, and the twenty-fourth connecting terminal connected to the first voltage source; and a thirteenth switch component, comprising a thirteenth control terminal, a twenty-fifth connecting terminal and a twenty-sixth connecting terminal, with the thirteenth control terminal receiving the (N+4)th stage start pulse signal or gate pulse signal, the twenty-fifth connecting terminal connected to the output terminal, and the twenty-sixth connecting terminal connected to the first voltage source, where N is an integer greater than 4.

2. The GOA circuit of claim 1, further comprising a capacitor, with its two ends connected to the third control terminal and the output terminal respectively.

3. The GOA circuit of claim 1, wherein all switch components, from the first to the thirteenth, are N-type metal oxide semiconductor (NMOS) transistors.

4. The GOA circuit of claim 1, wherein all switch components, from the first to the thirteenth, are P-type metal oxide semiconductor (PMOS) transistors.

5. The GOA circuit of claim 1, wherein the first clock signal and the second clock pulse signal are inversed.

6. The GOA circuit of claim 1, wherein a duty ratio of the first clock signal and the second clock pulse signal is 50%.

7. The GOA circuit of claim 1, wherein the pulse width of the first clock signal of the GOA circuit when driving two-dimensional (2D) images is twice the pulse width of the first clock signal of the GOA circuit when driving three-dimensional (3D) images.

8. The GOA circuit of claim 1, wherein the pulse width of the first clock signal of the GOA circuit when driving 2D images are twice the pulse width of the first clock signal of the GOA circuit when driving 3D images.

9. The GOA circuit of claim 8, wherein the phase difference between the first clock signal connected to the Nth stage GOA circuit unit and the first clock signal connected to the (N+1)th stage GOA circuit unit is one-fourth of the pulse width of the first clock signal when the GOA circuit is driving 2D images.

10. The GOA circuit of claim 8, wherein no phase difference exists between the first clock signal connected to the Nth stage GOA circuit unit and the first clock signal connected to the (N+1)th stage GOA circuit unit, and no phase difference exists between the first clock signal connected to the (N+2)th stage GOA circuit unit and the first clock signal connected to the (N+3)th stage GOA circuit unit when the GOA circuit is driving 3D images.

11. The GOA circuit of claim 10, wherein the phase difference between the first clock signal connected to the Nth stage GOA unit and the first clock signal connected to the (N+2)th stage GOA unit is half of the pulse width of the first clock signal.

12. A display device, comprising:
a liquid crystal display panel for showing images;
a gate driver on array (GOA) circuit, integrated on the liquid crystal display panel, the GOA circuit comprising a plurality of GOA units connected in cascade, with an Nth stage GOA unit outputting a Nth stage gate pulse signal from an output terminal; the Nth stage GOA unit comprises:
a first switch component, comprising a first control terminal, a first connecting terminal and a second connecting terminal, with the first connecting terminal and the first control terminal connected to a (N−4)th stage start pulse signal or a (N−4)th stage gate pulse signal;

a second switch component, comprising a second control terminal, a third connecting terminal and a fourth connecting terminal, with the second control terminal connected to the Nth pre-charged voltage node, the third connecting terminal connected to the first clock signal, and the fourth connecting terminal connected to the output terminal;

a third switch component, comprising a third control terminal, a fifth connecting terminal and a sixth connecting terminal, with the third control terminal connected to the second connecting terminal, the fifth connecting terminal connected to the first clock signal, and the sixth connecting terminal connected to the Nth stage start pulse signal;

a fourth switch component, comprising a fourth control terminal, a seventh connecting terminal and an eighth connecting terminal, with the fourth control terminal and the seventh connecting terminal connected to the first clock signal;

a fifth switch component, comprising a fifth control terminal, a ninth connecting terminal and a tenth connecting terminal, with the fifth control terminal receiving the Nth stage pre-charged voltage node, the ninth connecting terminal connected to the eighth connecting terminal, and the tenth connecting terminal connected to a first voltage source;

a sixth switch component, comprising a sixth control terminal, an eleventh connecting terminal and a twelfth connecting terminal, with the sixth control terminal connected to the eighth connecting terminal, the eleventh connecting terminal connected to the first clock signal, and the twelfth connecting terminal connected to the first voltage source;

a seventh switch component, comprising a seventh control terminal, a thirteenth connecting terminal and a fourteenth connecting terminal, with the seventh control terminal connected to the fifth control terminal, the thirteenth connecting terminal connected to the twelfth connecting terminal, and the fourteenth connecting terminal connected to the first voltage source;

an eighth switch component, comprising an eighth control terminal, a fifteenth connecting terminal and a sixteenth connecting terminal, with the eighth control terminal connected to the twelfth connecting terminal and the thirteenth connecting terminal, the fifteenth connecting terminal connected to the third control terminal, and the sixteenth connecting terminal connected to the output terminal;

a ninth switch component, comprising a ninth control terminal, a seventeenth connecting terminal and an eighteenth connecting terminal, with the ninth control terminal connected to the eighth control terminal, the seventeenth control terminal connected to the output terminal, and the eighteenth connecting terminal connected to the first voltage source;

a tenth switch component, comprising a tenth control terminal, a nineteenth connecting terminal and a twentieth connecting terminal, with the tenth control terminal connected to a second clock signal, the nineteenth connecting terminal connected to the output terminal, and the twentieth connecting terminal receiving the (N−4)th stage start pulse signal or gate pulse signal;

an eleventh switch component, comprising an eleventh control terminal, a twenty-first connecting terminal and a twenty-second connecting terminal, with the eleventh control terminal connected to the second clock signal, the twenty-first connecting terminal connected to the output terminal, and the twenty-second connecting terminal connected to the first voltage source;

a twelfth switch component, comprising a twelfth control terminal, a twenty-third connecting terminal and a twenty-fourth connecting terminal, with the twelfth control terminal connected to a (N+4)th stage start pulse signal or gate pulse signal, the twenty-third pathway connected to the third control terminal, and the twenty-fourth connecting terminal connected to the first voltage source; and a thirteenth switch component, comprising a thirteenth control terminal, a twenty-fifth connecting terminal and a twenty-sixth connecting terminal, with the thirteenth control terminal receiving the (N+4)th stage start pulse signal or gate pulse signal, the twenty-fifth connecting terminal connected to the output terminal, and the twenty-sixth connecting terminal connected to the first voltage source, where N is an integer greater than 4.

13. The display device of claim 12, further comprising a capacitor, with its two ends connected to the third control terminal and the output terminal respectively.

14. The display device of claim 12, wherein the first clock signal and the second clock pulse signal are inversed.

15. The display device of claim 12, wherein a duty ratio of the first clock signal and the second clock pulse signal is 50%.

16. The display device of claim 12, wherein the pulse width of the first clock signal of the GOA circuit when driving two-dimensional (2D) images is twice the pulse width of the first clock signal of the GOA circuit when driving three-dimensional (3D) images.

17. The display device of claim 12, wherein the pulse width of the first clock signal of the GOA circuit when driving 2D images are twice the pulse width of the first clock signal of the GOA circuit when driving 3D images.

18. The display device of claim 17, wherein the phase difference between the first clock signal connected to the Nth stage GOA circuit unit and the first clock signal connected to the (N+1)th stage GOA circuit unit is one-fourth of the pulse width of the first clock signal when the GOA circuit is driving 2D images.

19. The display device of claim 17, wherein no phase difference exists between the first clock signal connected to the Nth stage GOA circuit unit and the first clock signal connected to the (N+1)th stage GOA circuit unit, and no phase difference exists between the first clock signal connected to the (N+2)th stage GOA circuit unit and the first clock signal connected to the (N+3)th stage GOA circuit unit when the GOA circuit is driving 3D images.

20. The display device of claim 19, wherein the phase difference between the first clock signal connected to the Nth stage GOA unit and the first clock signal connected to the (N+2)th stage GOA unit is half of the pulse width of the first clock signal.

* * * * *